United States Patent
Starns et al.

(10) Patent No.: US 11,906,675 B2
(45) Date of Patent: *Feb. 20, 2024

(54) REAL-TIME DOSIMETRY

(71) Applicant: Reveam, Inc., Norcross, GA (US)

(72) Inventors: Chip Starns, Norcross, GA (US); Eric Burgett, Norcross, GA (US)

(73) Assignee: Reveam, Inc., Norcross, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/656,372

(22) Filed: Mar. 24, 2022

(65) Prior Publication Data

US 2022/0326396 A1 Oct. 13, 2022

Related U.S. Application Data

(63) Continuation of application No. 17/226,660, filed on Apr. 9, 2021, now Pat. No. 11,300,691.

(60) Provisional application No. 63/008,333, filed on Apr. 10, 2020.

(51) Int. Cl.
| | | |
|---|---|---|
| *G21K 5/04* | (2006.01) | |
| *G21K 5/10* | (2006.01) | |
| *G01T 1/142* | (2006.01) | |
| *H01J 29/76* | (2006.01) | |
| *H01J 37/244* | (2006.01) | |
| *H01J 37/30* | (2006.01) | |

(52) U.S. Cl.
CPC ............ *G01T 1/142* (2013.01); *G21K 5/04* (2013.01); *G21K 5/10* (2013.01); *H01J 29/76* (2013.01); *H01J 37/244* (2013.01); *H01J 37/30* (2013.01); *H01J 2237/24507* (2013.01)

(58) Field of Classification Search
CPC .. G01T 1/142; G21K 5/04; G21K 5/10; H01J 29/76
See application file for complete search history.

(56) References Cited

U.S. PATENT DOCUMENTS

| | | | |
|---|---|---|---|
| 6,617,596 B1 | 9/2003 | Korenev | |
| 11,300,691 B2 * | 4/2022 | Starns | G21K 5/10 |
| 2021/0318453 A1 | 10/2021 | Starns et al. | |

* cited by examiner

*Primary Examiner* — Mark R Gaworecki
(74) *Attorney, Agent, or Firm* — Lee & Hayes P.C.

(57) ABSTRACT

An apparatus, system, and method for real-time dosimetry. An electron beam irradiation system includes one or more detectors. The detectors have coils that, when an electron travels by a sensor pad in the detector, the electron induces a current into the coils. The current is detected and the electron is counted. The number of electrons counted at the one or more detectors is compared to the number of electrons leaving an electron gun, giving a dosage of the workpiece being irradiated.

17 Claims, 11 Drawing Sheets

REAL-TIME DOSIMETRY

CROSS REFERENCE TO RELATED APPLICATIONS

This application is a continuation of co-pending U.S. patent application Ser. No. 17/226,660 filed Apr. 9, 2021, which claims the benefit of U.S. Provisional Application No. 63/008,333 filed Apr. 10, 2020, entitled "Real-Time Dosimetry", which is incorporated herein by reference in its entirety.

BACKGROUND

Systems that use radiation for various reasons typically use methods to measure the dosage provided. For example, some systems use alanine pellet dosimeters to measure radiation exposure. Ionizing radiation causes radicals in the pellet, the number of which are proportional to the radiation received. Electron spin resonance procedures are used to measure the number of radicals created, resulting in a dosage output.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1A:
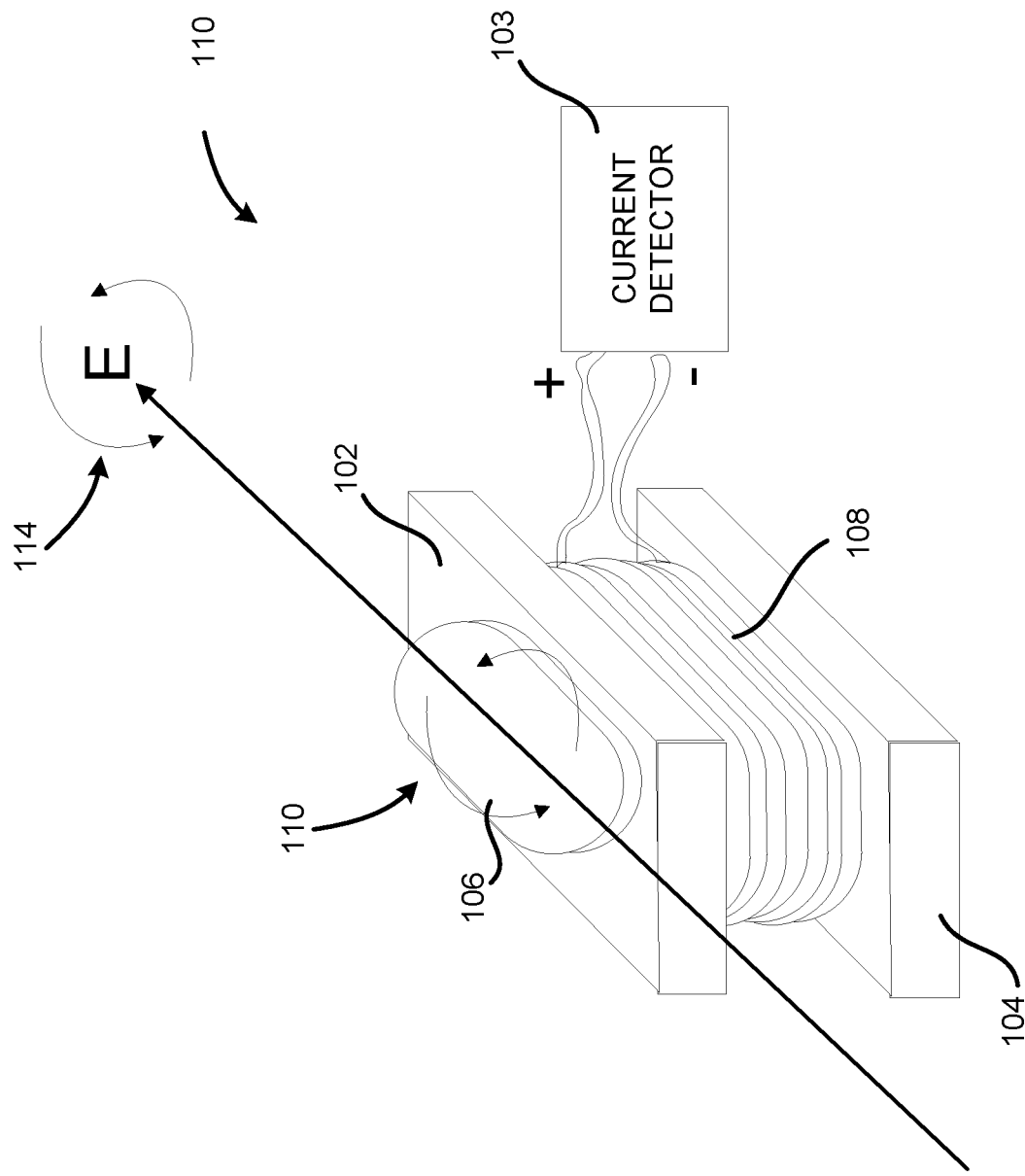
FIGS. 1A and 1B are illustrations of an example detector.

Described herein are technologies for real-time dosimetry of radiation-emitting systems. In some examples, one or more magnetic sensors are positioned proximate to an electron beam horn of an electron beam ("e-beam") processing device emitting a plurality of electrons. The magnetic sensor detects an electron moving in a proximity to the sensor. A total number of electrons detected by the sensor. The total number of electrons is determined and compared to the number of electrons determined to be emitted by the electron beam system.

In some examples, the electron sensor is an energized coil that creates a magnetic field. As an electron travels at a speed and direction, the electron will create a magnetic field. As the electron passes by the electron sensor, the magnetic field of the electron disturbs the magnetic field of the current carrying coil of the electron sensor. The disturbance is used to detect the passage of an electron by the sensor.

While some technical details are presented herein in the general context of program modules, those skilled in the art will recognize that the configurations can also be implemented in combination with other program modules. Generally, program modules include routines, programs, components, data structures, and other types of structures that perform particular tasks or implement particular abstract data types.

Moreover, those skilled in the art will appreciate that the configurations described herein can be practiced with various computer system configurations, including hand-held devices, multiprocessor systems, microprocessor-based or programmable consumer electronics, minicomputers, mainframe computers, and the like. The configurations described herein can also be practiced in distributed computing environments where tasks are performed by remote processing devices that are linked through a communications network. In a distributed computing environment, program modules can be located in both local and remote memory storage devices.

In the following detailed description, references are made to the accompanying drawings that form a part hereof, and in which are shown by way of illustration specific configurations or examples. Referring now to the drawings, aspects of the various implementations provided herein and an exemplary operating environment will be described.

FIG. 1A is a side, elevated, perspective view of a detector 110 in which aspects of real-time dosimetry are explained. The detector 110 is a balun-type electron detector. the detector 110 includes a top plate 102, a bottom plate 104 and a sensor pad 106. The top plate 102 and the bottom plate 104 can be constructed of various materials. For example, the top plate 102 and the bottom plate 104 can be constructed of various plastics and ceramics. The sensor pad 106 is constructed of a material conducive to the construction and propagation of a magnetic field. Such materials include materials such as metals (including copper, silver, gold, and the like) and other materials such as ceramics (including those that are super cooled). Between the top plate 102 and the bottom plate 104 is coil 108. The coil 108 is a wound, electrically conductive, insulated wire.

During operation, when an electron 114 transmitted from an electron gun of a radiation system (described by way of example in FIG. 1), passes by the sensor pad 106, the movement and charge of the electron 114 induces a current into the coil 108, which is measured by a current detector 103. An electron moving creates a magnetic field, which can be found using equation (1)

$$B = e \times v, \qquad \text{Equation (1),}$$

Where B is the magnetic field, e is the charge on the electron 114, and v is the instantaneous velocity of the electron 114. An equation for computing a hypothetical current can be found using equation (2):

$$i = E_v e v, \qquad \text{Equation (2)}$$

where i is the instantaneous current received by the current detector 103 due to the electron's 114 motion, e is the charge on the electron 114, v is the instantaneous velocity of the electron 114, and $E_v$ is the component in the direction of v of that electric field which would exist at the electron's 114 instantaneous position under various circumstances. Using the principle that an electron (electron 114) moving in the presence of a conductor (the coil 108) creates a current, the detector 110 can be used to detect electrons of an irradiation system.

It should be noted that in some examples, the coil 108 may be energized, creating a magnetic field. In those examples, the electron can be detected by detecting the disturbance of the magnetic field of the energized coil 108 by the electron 114. It should also be noted that the presently disclosed subject matter is not limited to the movement of the electron 114 in the direction depicted in FIG. 1A, as various directions of the electron 114 can be detected the by detector 110.

Figure 1B:
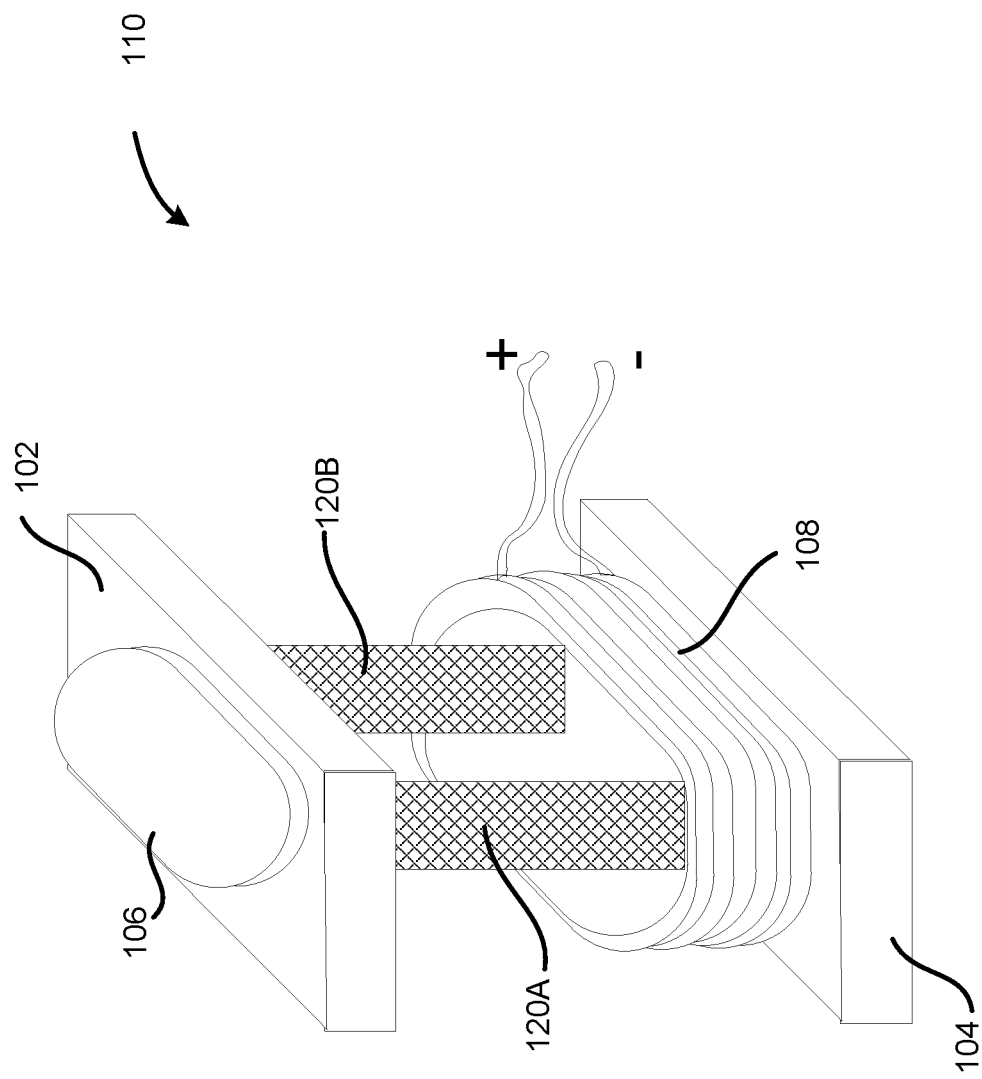
Figure 2A:
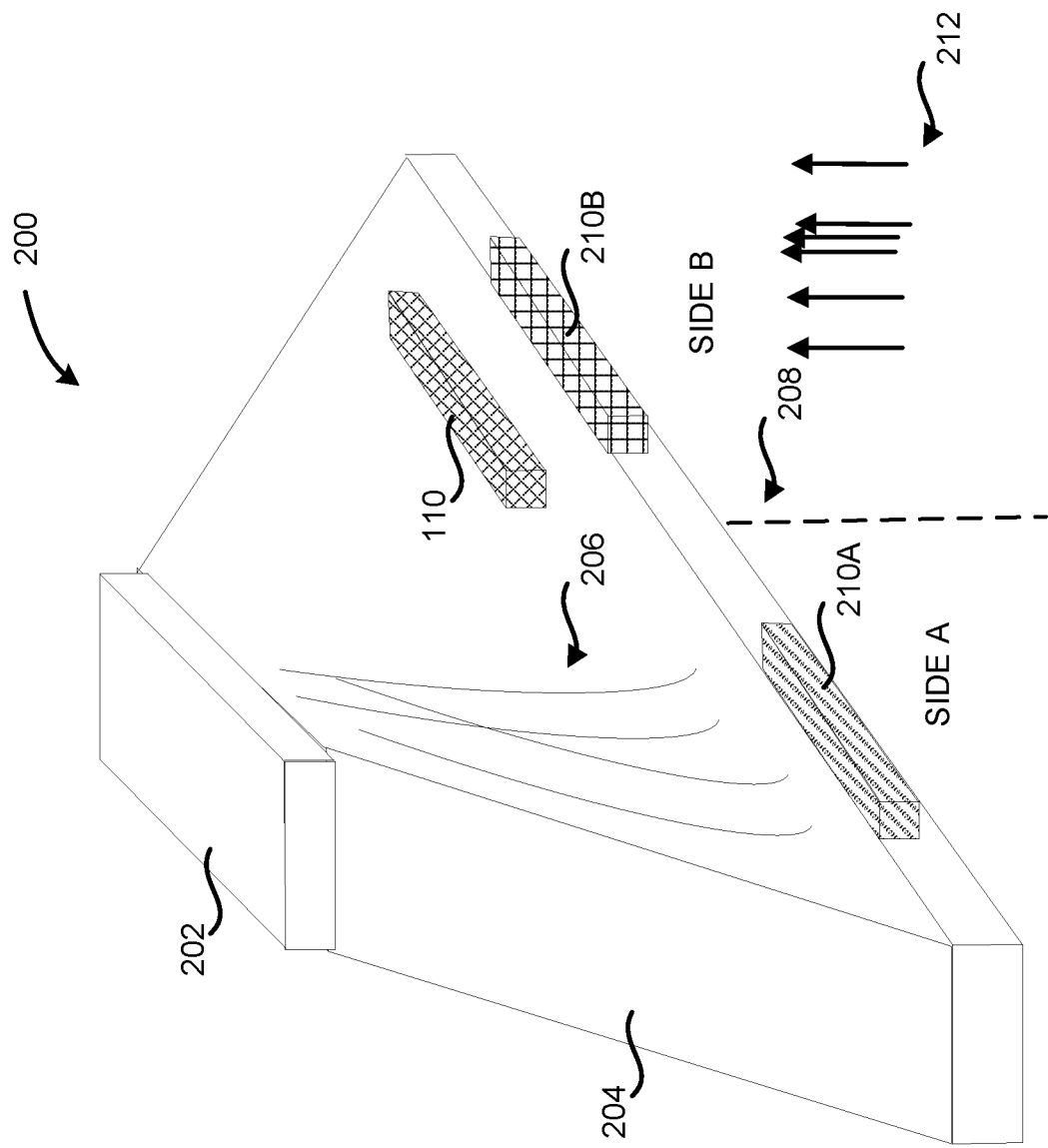
FIG. 2A is a side, perspective view of an example electron beam gun.

FIG. 1B is an exploded, side perspective view of the detector 110. The detector 110 includes a top plate 102, a bottom plate 104, the sensor pad 106, and the coil 108. To help build the magnetic field to cause the creation of an electrical current by the electron 114 of FIG. 1A, the detector 110 can include a core 120A and a core 120B. The core 120A and the core 120B can be constructed of a material such as ferrite, soft or annealed iron, or a magnetically neutral material such as porcelain (typically used to support the coil 108). The coil 108 and the cores 120A and 102B (which may be one piece or separate as illustrated in FIG. 2A) can be wound in such a manner as to operate like a balun. As used herein, a balun is an electrical device that converts between a balanced signal and an unbalanced signal.

FIG. 2A is a side, perspective view of an example electron beam gun 200, according to various configurations described herein. In FIG. 2A, the electron beam gun 200 has an electron emitter 202 and a horn 204. The electron emitter 202 emits electrons 206 at desirably a particular energy. The horn 204 has an internal volume and is designed to act as a conduit of the electrons 206 towards an exit 208.

To direct the electrons 206, the horn 204 includes redirecting magnets 210A and 210B. The redirecting magnets 210A and 210B can be installed inside the volume of the horn 204 or can be installed outside the volume of the horn 204. The presently disclosed subject matter is not limited to any particular manner of installation of the redirecting magnets 210A and 210B. The redirecting magnets 210A and 210B create a magnetic field that direct the electrons 206 towards a particular direction through the horn 204. In the example illustrated in FIG. 2, the electrons 206 are directed in a manner so that the electrons 206 exit the horn 204 on side A of the horn 204.

The horn 204 also includes the detector 110 installed in the internal volume of the horn 204. The detector 110 is placed and configured to detect electrons 212 emitted from an accompanying electron beam gun. In this configuration, the electrons 206 emitted from the electron beam gun 200 travel substantially and are emitted on one side of the horn 204, side A, whereas electrons 212 emitted from an accompanying electron beam gun travel into the other side, side B, of the horn 204 and are detected by the detector 110, explained in more detail in FIG. 2B.

Figure 2B:
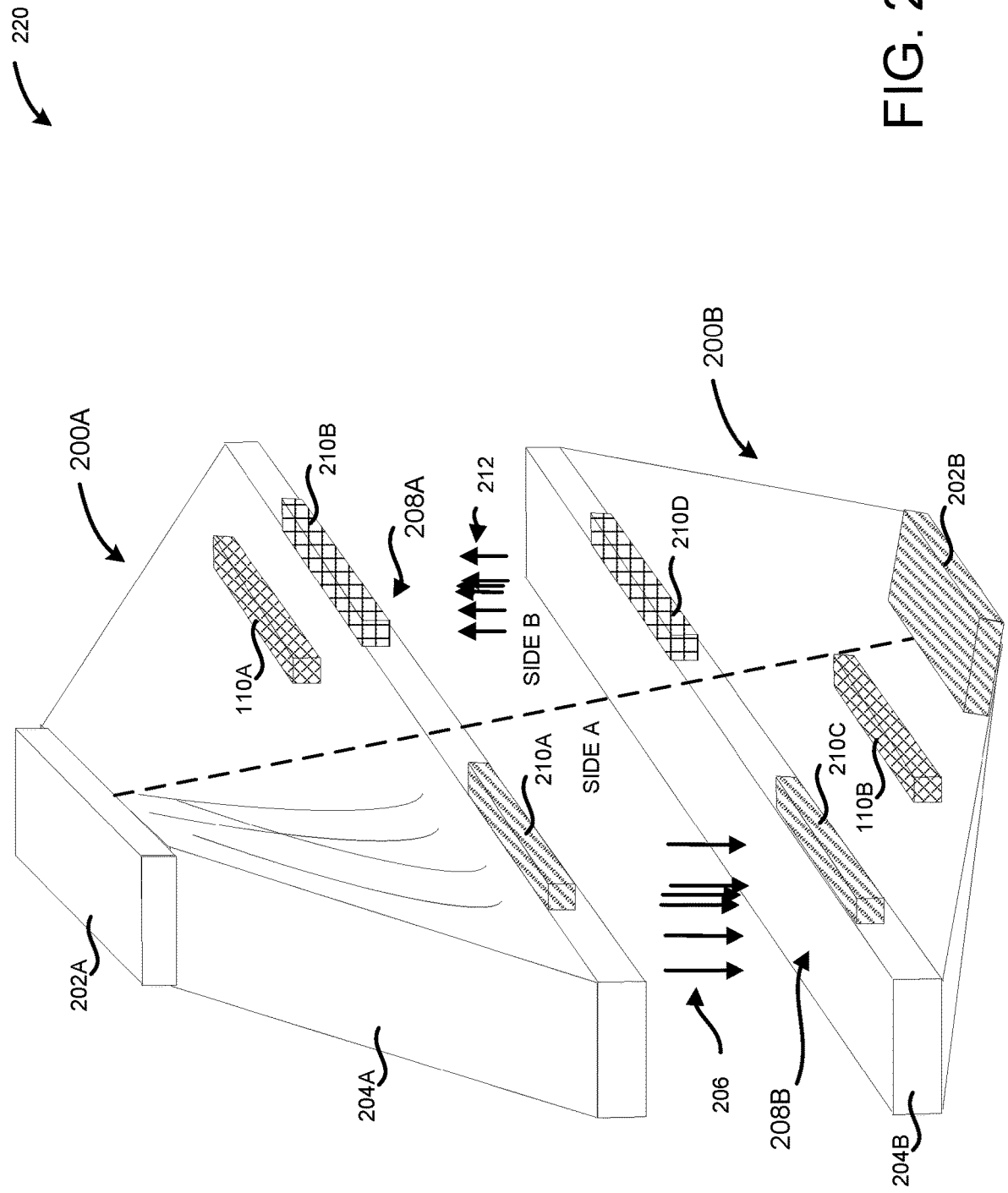
FIG. 2B is a side, perspective view of an irradiation system.

FIG. 2B is a side, perspective view of an irradiation system 220, according to various examples described herein. The irradiation system 220 includes an electron beam gun 200A and an electron beam gun 200B. The electron beam gun 200A includes an electron emitter 202A, a horn 204A. The electron emitter 202A emits electrons 206 at a desirable energy. The horn 204A has an internal volume and is designed to act as a conduit of the electrons 206 towards an exit 208A. To direct the electrons 206, the horn 204A includes redirecting magnets 210A and 210B. The redirecting magnets 210A and 210B create a magnetic field that direct the electrons 206 towards a particular direction through the horn 204A. In the example illustrated in FIG. 2B, the electrons 206 are directed in a manner so that the electrons 206 exit the horn 204A on side A of the horn 204A.

In a similar manner, the electron beam gun 200B includes an electron emitter 202B and a horn 204B. The electron emitter 202B emits electrons 212 at a desirable energy. The horn 204B has an internal volume and is designed to act as a conduit of the electrons 212 towards an exit 208B. To direct the electrons 212, the horn 204B includes redirecting magnets 210C and 210D. The redirecting magnets 210C and 210D create a magnetic field that direct the electrons 212 towards a particular direction through the horn 204B. In the example illustrated in FIG. 2B, the electrons 212 are directed in a manner so that the electrons 212 exit the horn 204B on side B of the horn 204B.

As illustrated in the irradiation system 220, electrons emitted from an electron emitter of one of the electron beam guns exit through one side of the horn and electrons received from an electron emitter of another electron beam guns enter through the other side of the horn. For example, the electrons 206 emitted from the electron beam gun 200A exit from side A of the horn 204A and the electrons 212 emitted from the electron beam gun 200B are received into side B of the horn 204A. In a similar manner, the electrons 212 emitted from the electron beam gun 200B exit from side B of the horn 204B and the electrons 206 emitted from the electron beam gun 200A are received into side A of the horn 204B.

To detect the electrons 212 emitted from the horn 204B, the electron beam gun 200A includes a detector 110A. To detect the electrons 206 emitted from the horn 204A, the electron beam gun 200B includes a detector 110B. In some examples, the detectors 110A and 110B are constructed and operate in a manner as described in FIGS. 1A and 1B for the detector 110.

Figure 3:
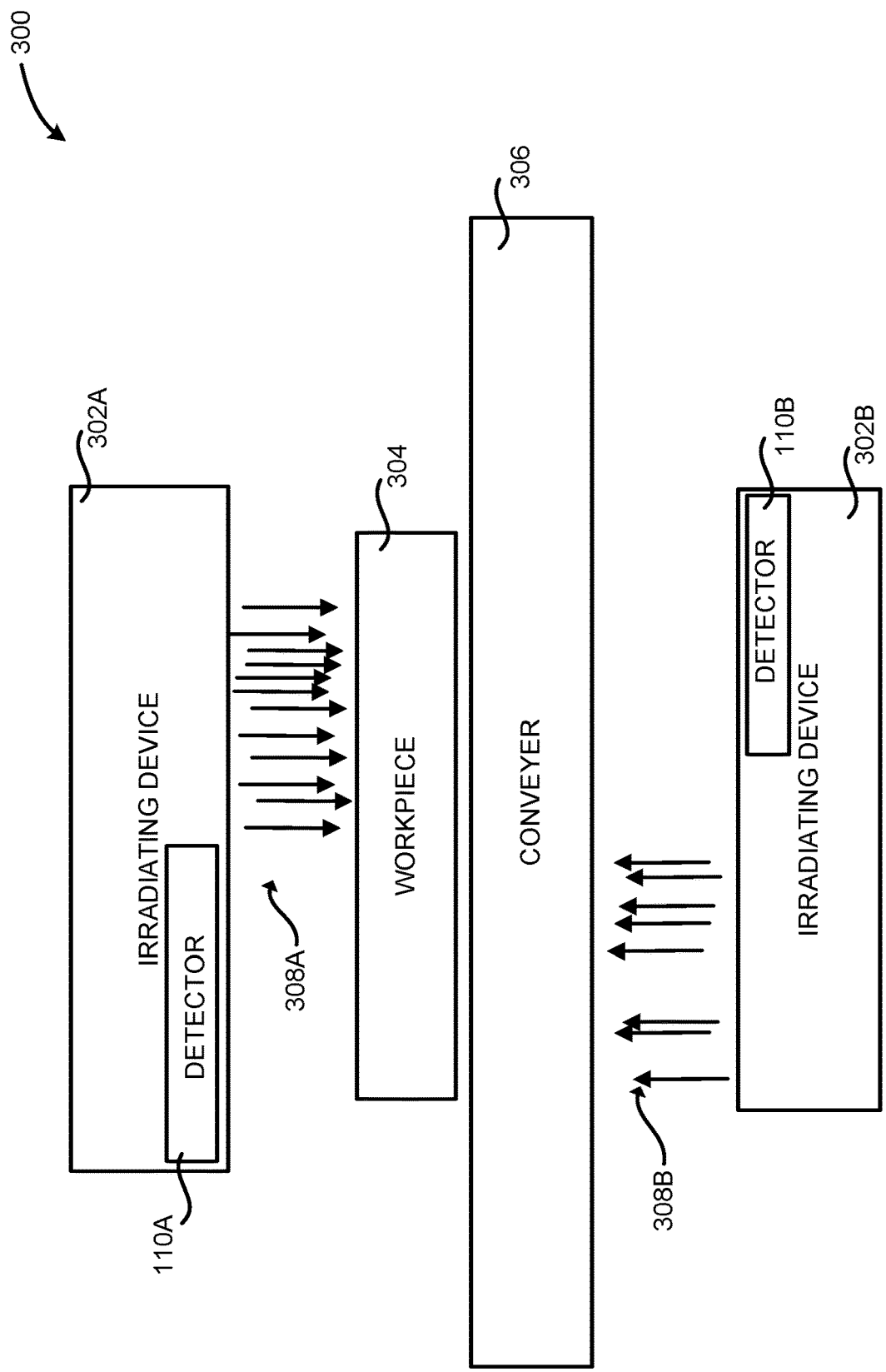
FIG. 3 is a side-view of another example irradiation system.

FIG. 3 is a side-view of an example irradiation system 300. The irradiation system 300 of FIG. 3 includes an irradiating device 302A and an irradiating device 302B. Although more than one irradiating device is illustrated in FIG. 3, it should be understood that the presently disclosed subject matter is not limited to the use of any particular number of irradiating devices. For example, only one irradiating device may be used. In other examples, two or more irradiating devices may be used.

The irradiating devices 302A and 302B are, in the example provided in FIG. 3, electron beam irradiating devices. Each of the irradiating devices 302A and 302B include an electron gun (not shown). The electron gun includes a cathode, a grid, and an anode that generates and accelerates a primary beam. One more magnets situated at the output of the electron gun focus the primary beam on the material being processed, or a workpiece 304. In operation, the gun cathode is the source of thermally emitted electrons that are both accelerated and shaped into a collimated beam by the electrostatic field geometry established by the gun electrode (grid and anode) configuration used.

The electron beam then emerges from the gun assembly through an exit hole in the ground-plane anode with an energy equal to the value of the negative high voltage (gun operating voltage) being applied to the cathode. After exiting the gun, the beam can pass through an electromagnetic lens and deflection coil system. The lens is used for producing either a focused or defocused beam spot on the workpiece, while the deflection coil is used to either position the beam spot on a stationary location or provide some form of oscillatory motion.

In some examples, the workpiece is organic material such as vegetables, seafood, fruit, or other food items. The dosage and power of the electron beam is designed to sterilize the food items. In some examples, the electrons break the chains of DNA in living organisms, such as bacteria, resulting in microbial death and rendering the space they inhabit sterile. E-beam processing has been used for the sterilization of medical products and aseptic packaging materials for foods, as well as disinfestation, the elimination of live insects from grain, tobacco, and other unprocessed bulk crops.

In the example illustrated in FIG. 3, the workpiece 304 is moved under the irradiating devices 302A and 302B by a conveyer 306. The conveyer 306 can be configured with rollers (not shown) with spaces between the rollers that allow the passage of an electron field 308A from the irradiating device 302A or an electron field 308B from the irradiating device 302B to pass through the conveyer 306. At least a portion of the electron field 308A from the irradiating device 302A or at least a portion of the electron field 308B from the irradiating device 302B is intended to impinge upon the DNA of organisms in the workpiece 304, and preferably at least partially sterilizing the workpiece 304.

During operation, it may be important or necessary to determine the dosage of ionizing radiation the workpiece 304 receives from the electron field 308A from the irradiating device 302A or the electron field 308B from the irradiating device 302B. The dosage can be used to determine the probability that organisms within the workpiece 304 have received some degree of ionizing radiation and can also be used to determine the probability that the workpiece 304 has been sterilized to a certain degree.

To measure the amount of ionizing radiation the workpiece 304 receives, the irradiation system 300 includes the detector 110A and a detector 110B. The detector 110A and 110B are constructed and operate in a manner described in FIGS. 1A and 1B, above. Although more than one detector is illustrated in FIG. 3, it should be understood that the presently disclosed subject matter is not limited to the use of any particular number of detectors. For example, only one detector may be used. In other examples, two or more detectors may be used.

The detectors 110A and 110B are designed to detect the movement of an electron passing a sensor of the detector 110A and 110B, described in more detail in FIGS. 1A and 1B, above. The movement of an electron in the electron field 308A or an electron in the electron field 308B generates a current, which is measured and recorded as a count of an electron. The number of counts is used to determine the amount of radiation detected by the detector 110A or 110B. In some examples, the difference between the number of electrons in the electron field 308A or 308B and the counts are used to determine the dosage of the workpiece 304.

For example, the number of electrons, Et, transmitted by the irradiating device 302A may be known (either through testing or some other manner). In some examples, the output current of the irradiating device 302A is measured and equated to a number of electrons. The detector 110B may detect a number of electrons Er (electrons detected) that passed through the workpiece 304 and the conveyer 306 (as well as other potential items such as carboard containers and the like). The number of electrons adsorbed by the workpiece 304, assuming no other adsorbing materials, can be found by taking the difference between Et and Er, resulting in Ed (electron dosage). The Ed may be used to calculate the total dosage to the workpiece 304 using various formulae known to those of ordinary skill in the relevant art.

During the operation of the irradiation system 300 of FIG. 3, a workpiece 304, such as food or another item to be sterilized, is placed in a cart or other container (not shown). In some examples, the container may be the container used to or transport the workpiece 304. If a container is used, the adsorption rate of electrons of the container may be known or calculated before any irradiation takes place. The adsorption of electrons by the container can, therefore, be accounted for when determining a dosage of the workpiece 304.

The workpiece 304 is moved along the conveyer 306 at a pre-determined rate depending on the amount of material the workpiece 304 contacts, the power of the irradiating devices 302A and 302B, and the dosage required or desired. The detectors 110A and 110B detect the presence of moving electrons.

In some examples, the irradiating device 302A fires (energizes) for a period of time then deenergizes. A period of time after the irradiating device 302A deenergizes, the irradiating device 302B fires for a period of time and then deenergizes. The process can repeat a desired number of times. In some examples, the irradiating device 302A and the irradiating device 302B alternatively energize for a period of 1-10 milliseconds, and in some examples, approximately 5 milliseconds, with a time period of less than 1 millisecond between the energization periods, though the presently disclosed subject matter is not limited to any particular time frame.

The detectors 110A and 110B detect the movement of electrons past their sensors. In some examples, the detector 110A is in an opposite polarity to detector 110B by having the coils of the detector 110A wound in an opposite direction to the coils of the detector 110B. By way of example, being an opposite polarity means that an electron traveling in the same direction will be detected as a positive value by one of the detectors and a negative value by the other, as shown in more detail in FIGS. 3 and 4. The workpiece 304 is continually moved through the electron field 308A or the electron field 308B at a rate and speed dependent on various factors such as the dosage required and the power of the irradiating devices 302A and 302B. Once irradiated, the workpiece 304 is moved to a location for shipping.

Figure 4A:
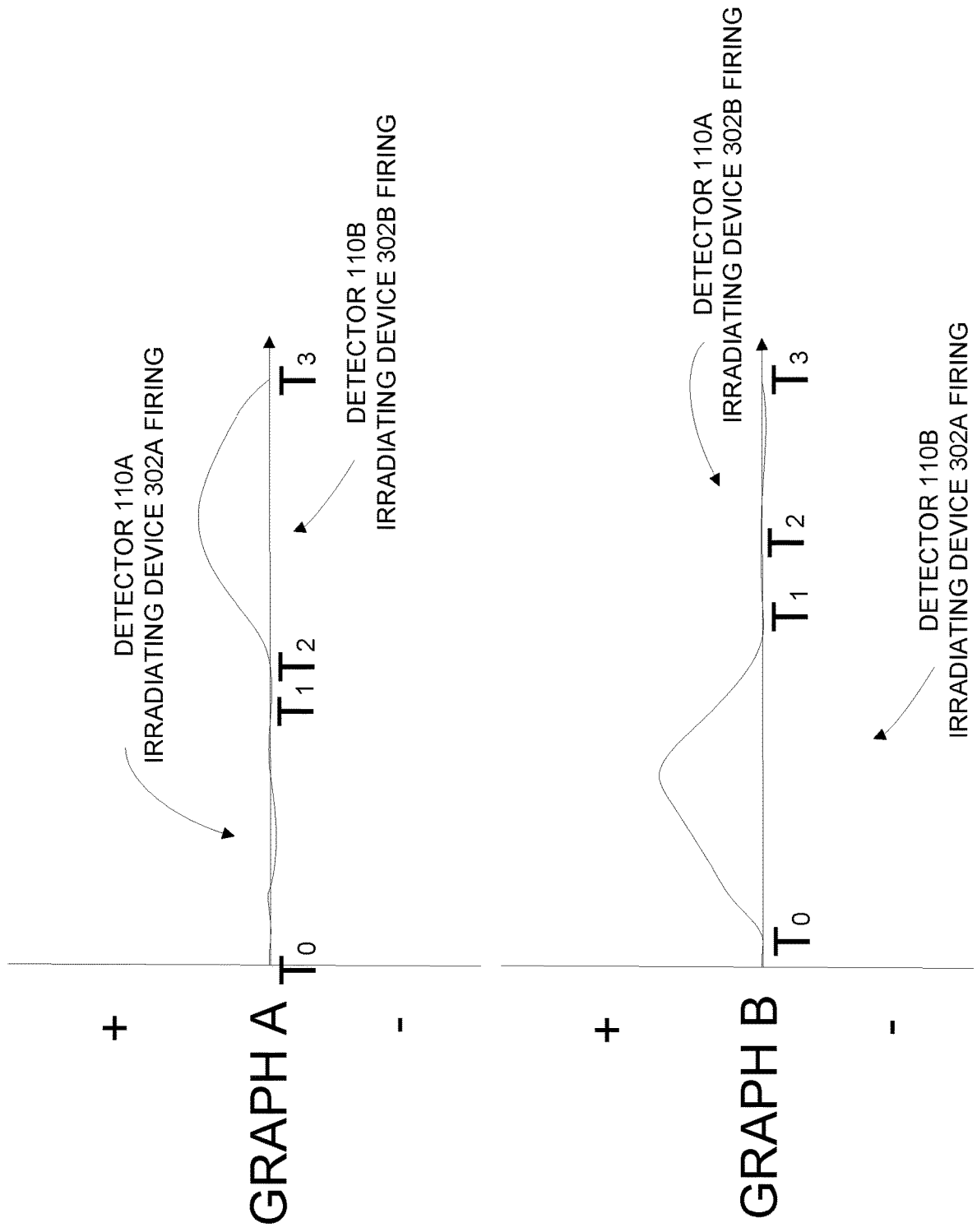
FIGS. 4A and 4B are example graphs showing the measurement of electrons by the detectors.

FIG. 4A is an example graph showing the measurement of electrons by the detectors 110A and 110B. In FIG. 4A, Graph A shows that when irradiating device 302A is firing from time T0 to time T1, the detector 110A is not detecting much, if any, electron activity. As noted above with respect to FIGS. 2A and 2B, the detectors 110A and 110B are offset. Thus, when the irradiating device 302A is firing, little, if any, electrons emitted from the irradiating device 302A are moving past the detector 110A. Thus, while the irradiating device 302A is firing from time T0 to time T1, the detector 110A is not detecting much, if any, electron activity. However, the detector 110B is detecting the movement of electrons pasts the detector 110B. Thus, in Graph B, it is shown from time T0 to time T1, the detector 110B is detecting electron activity.

From time T1 to time T2, the irradiating device 302A has ceased firing. From time T2 to time T3, the irradiating device 302B is firing. When the irradiating device 302B is firing, little, if any, electrons emitted from the irradiating device 302B are moving past the detector 110B. Thus, while the irradiating device 302B is firing from time T2 to time T3, the detector 110B is not detecting much, if any, electron activity. However, the detector 110A is detecting the movement of electrons past the detector 110A. Thus, in Graph B, it is shown from time T2 to time T3, the detector 110B is detecting little electron activity, while in graph A during the same timeframe, the detector 110A is detecting electron activity.

Figure 4B:
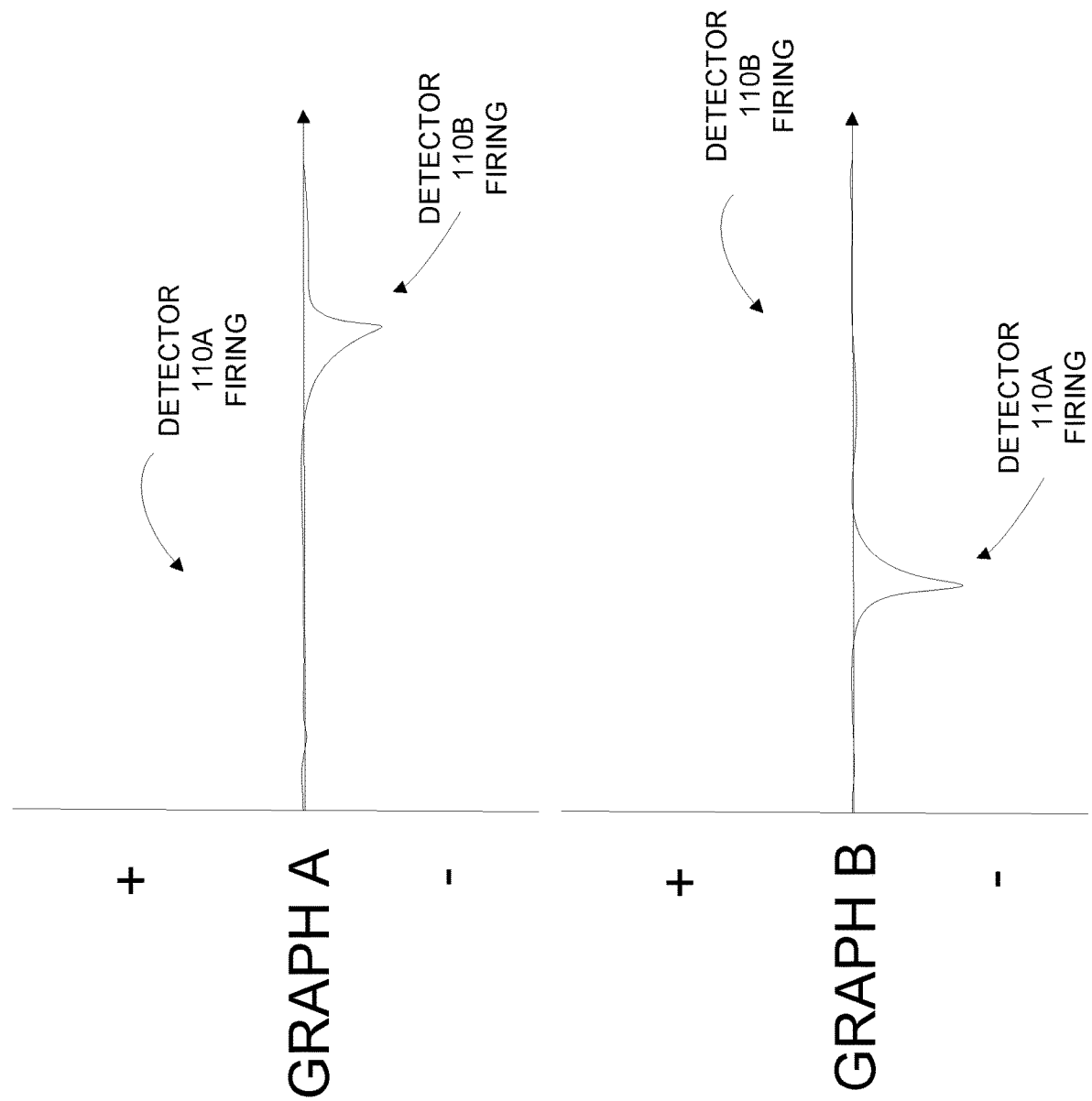

FIG. 4B is an example graph showing a modified electron count configuration. In the graphs illustrated in FIG. 4A, the curves can represent an electron moving past the detector 110A or the detector 110B. The height of the curves can represent the current developed by the moving electron. However, the current is an analog function. In other words, current is developed as the electron moves closer to the sensor of the detector 110A or 110B, causing a gradual rise and fall of the current, as illustrated in FIG. 4A.

In FIG. 4B, however, an integrator circuit, as may be found in the conventional art, has been placed on the output of the detector 110A or the detector 110B. The output waveforms illustrated by Graphs A and B are integrated to provide an output illustrated by Graphs C and D in FIG. 4B. The integrated output can provide a cleaner signal to a counter, as the peaked output shown in Graphs C and D can be equated to a "count" or the movement of an electron past the detector 110A or the detector 110B.

Figure 5:
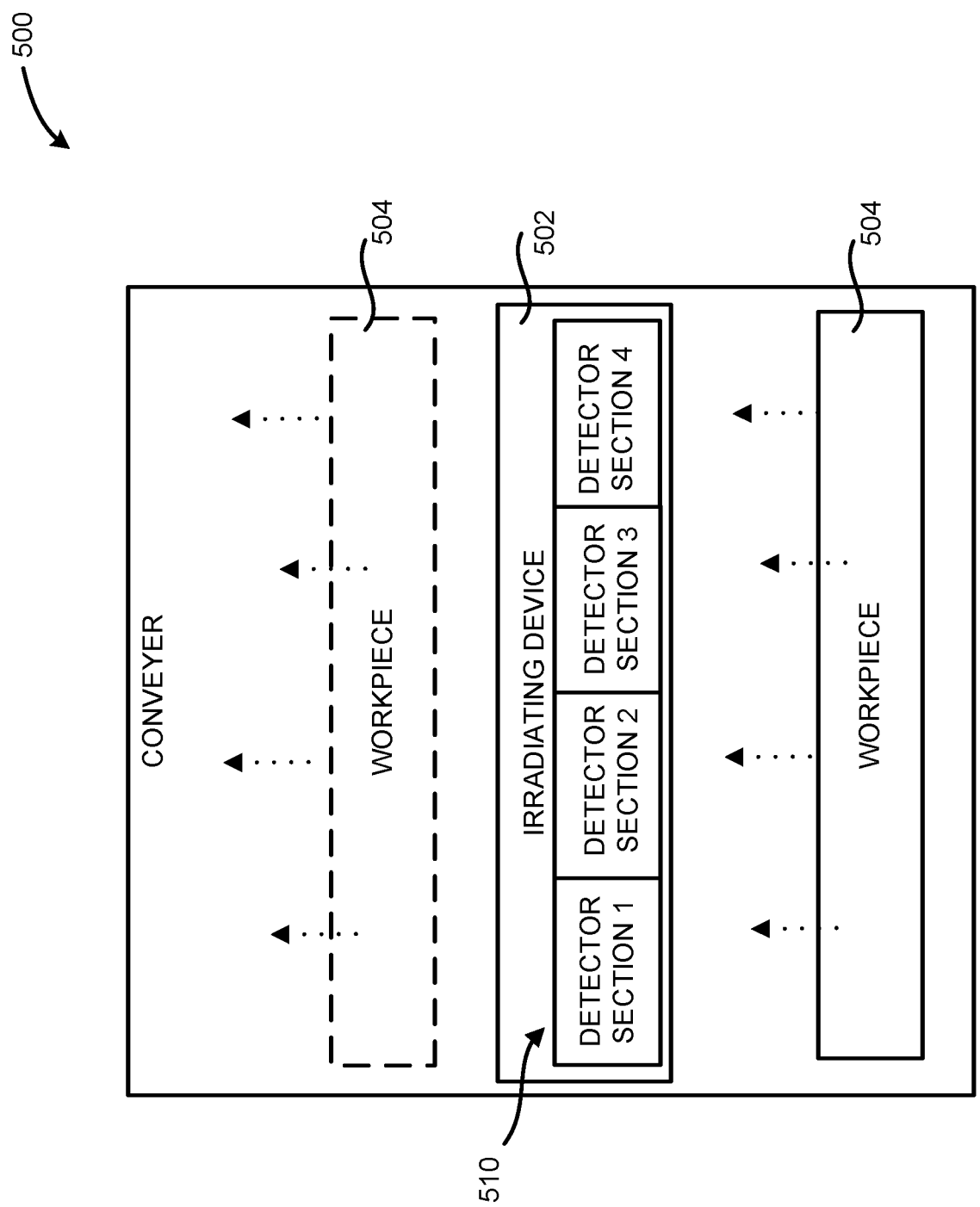
FIG. 5 is a top-down view of an irradiation system configured to measure beam profilometry by using multiple detectors.

FIG. 5 is a top-down view of an irradiation system 500 configured to measure beam profilometry by using multiple detectors. In some examples, it may be desirable to measure the profile of the electrons as the electrons exit from the irradiating device 502 or as they enter the irradiating device 502. A benefit of beam profilometry is that the beam profile can be measure across a workpiece 504 as the workpiece 504 moves through the electron field emitted by the irradiating device 502. A beam profile can provide various benefits. For example, a beam having a strong beam area along with a weak beam area can indicate a failure of components such as redirecting magnets.

To provide a profile of an electron beam, the irradiating device 502 includes a detector 510. The detector 510 includes multiple sensors, indicated in FIG. 5 as detector section 1 through detector section 4. Each detector section is comprised of a detector, such as the detector 110 illustrated in FIG. 1. Each detector section can detect a portion of electrons in an electron field moving past the particular detector section. Thus, the detection of an electron field can be partitioned into multiple segments, providing a profile of an electron field across the workpiece 504.

Figure 6:
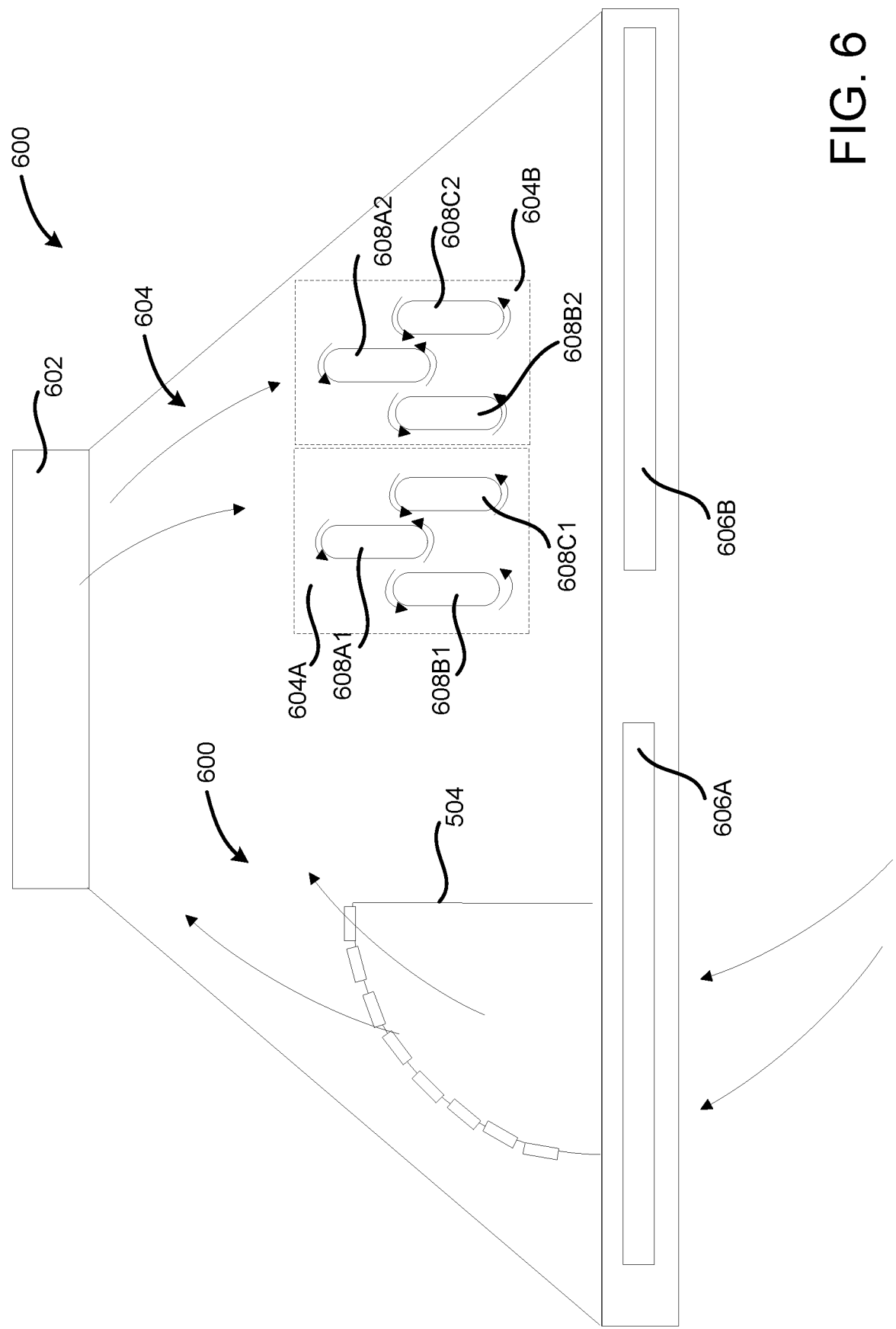
FIG. 6 is a front view of a horn 600 that may be used for real-time dosimetry

FIG. 6 is a front view of a horn 600 that may be used for real-time dosimetry. The horn 600 of FIG. 6 includes an electron emitter 602, which emits electrons. The electrons 604 are steered through detector units 604A and 604B using redirector magnets 606A and 606B. The redirector magnets 606A and 606B create a magnetic field that steers the electrons 604 towards the detector units 604A and 604B.

The detector unit 604A includes center detector 608A1 and side detectors 608B1 and 608C1. The detector unit 604B includes center detector 608A2 and side detectors 608B2 and 608C2. The center detectors 608A1 and 608A2, and the side detectors 608B1, 608C1, 608B2, and 608C2 are constructed in a manner similar to the detector 110 of FIGS. 1A and 1B. In FIG. 6, the coils of the side detectors 608B1, 608C1, 608B2, and 608C2 are wound in a direction opposite to the center detectors 608A1 and 608A2.

The different directions of the windings allow the detector unit 604A and 604B to, in some examples, increase an accuracy of the detection of an electron. The center detectors 608A1 and 608A2 act as a center balun with the side detectors 608B1, 608C1, 608B2, and 608C2 acting as toroidal baluns. This allows the profiling of the electrons 604 as the electrons pass by the detector units 604A and 604B. As used herein, a profile is the amount or number of electrons passing by the detector units 604A and 604B as the electrons 604 exit the horn 600.

The configuration illustrated in FIG. 6, whereby the center detectors 608A1 and 608A2 are offset from their respective side detectors 608B1, 608C1, 608B2, and 608C2 allows the negation of the electron fields of electrons moving close but not through the detector units 604A and 604B, reducing the probability of overcounting the number of electrons 604.

Figure 7:
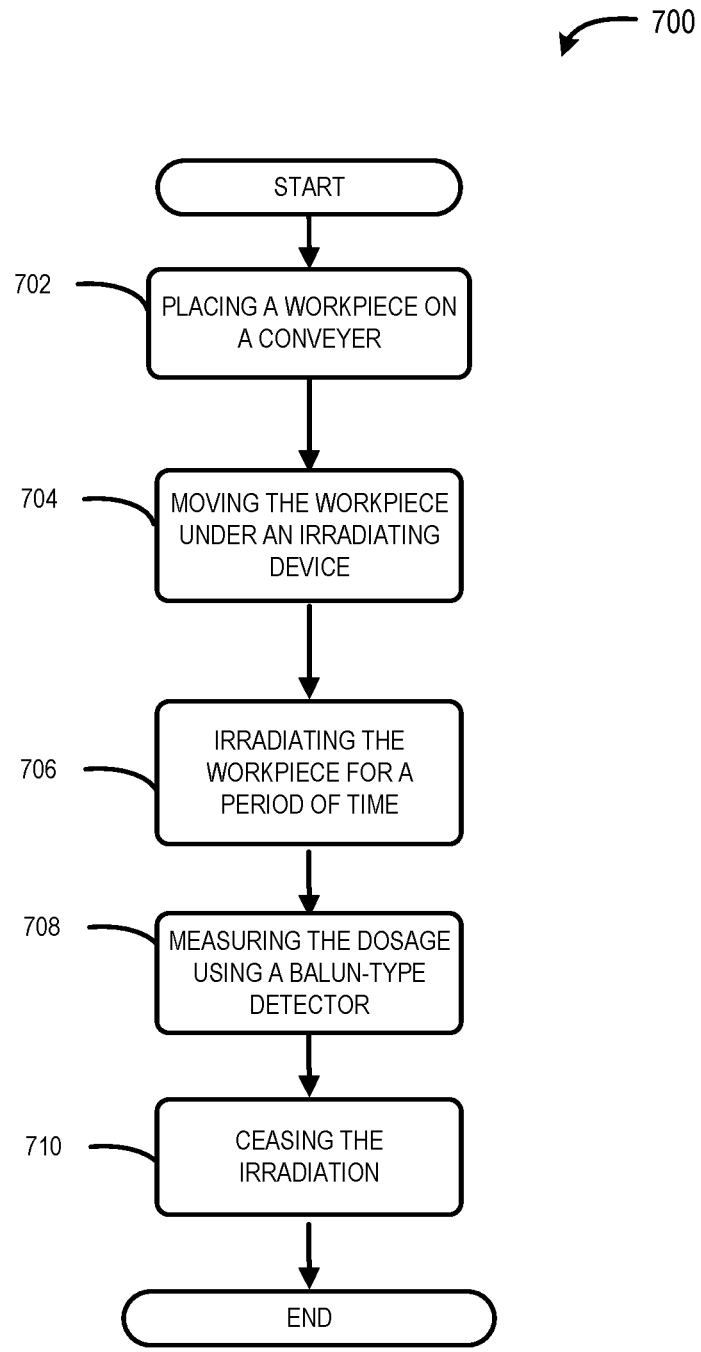
FIG. 7 illustrates an example real-time dosimetry process.

FIG. 7 illustrates an example process 700 for real-time dosimetry. The process 700 is illustrated as example flow graphs, each operation of which may represent a sequence of operations that can be implemented in hardware, software, or a combination thereof. In the context of software, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the processes.

Referring now to FIG. 7, the process 700 commences at operation 702, where the workpiece 304 is placed on a conveyer 306. The conveyer 306 moves the workpiece 304 along a distance. For example, the conveyer 306 may be used to move the workpiece 304 from a truck into a shielded area designed for electron beam irradiation.

The process 700 continues at operation 704, where the workpiece is moved under an irradiating device. The irradiating device, in some examples described herein, is an electron beam irradiating device configured to emit electrons at a particular energy level at a particular direction using a grid or array of magnets designed to steer the electrons.

The process 700 continues at operation 706, where the workpiece 304 is irradiated by the irradiating device.

The process 700 continues at operation 708, where the dosage of the electrons received by the workpiece 304 is measured. In some examples, the dosage is measured using a balun-type detector. A balun-type detector, such as the one illustrated in FIGS. 1A and 1B, have a center core surrounded by a coil. The movement of the electron past a pad on the detector imparts a current (and voltage) into the coil. The current is detected and counted. The total number of electrons detected and counted leaving an irradiating device are compared to the number of electrons detected after exiting the workpiece 304. The difference is used to calculate the dosage received by the workpiece 304.

The process 700 continues to operation 710, where the irradiation is ceased by turning off the irradiating device. In some examples, a second irradiating device may be energized, such as the configuration illustrated in FIG. 2B. The process 700 can thereafter end.

Figure 8:
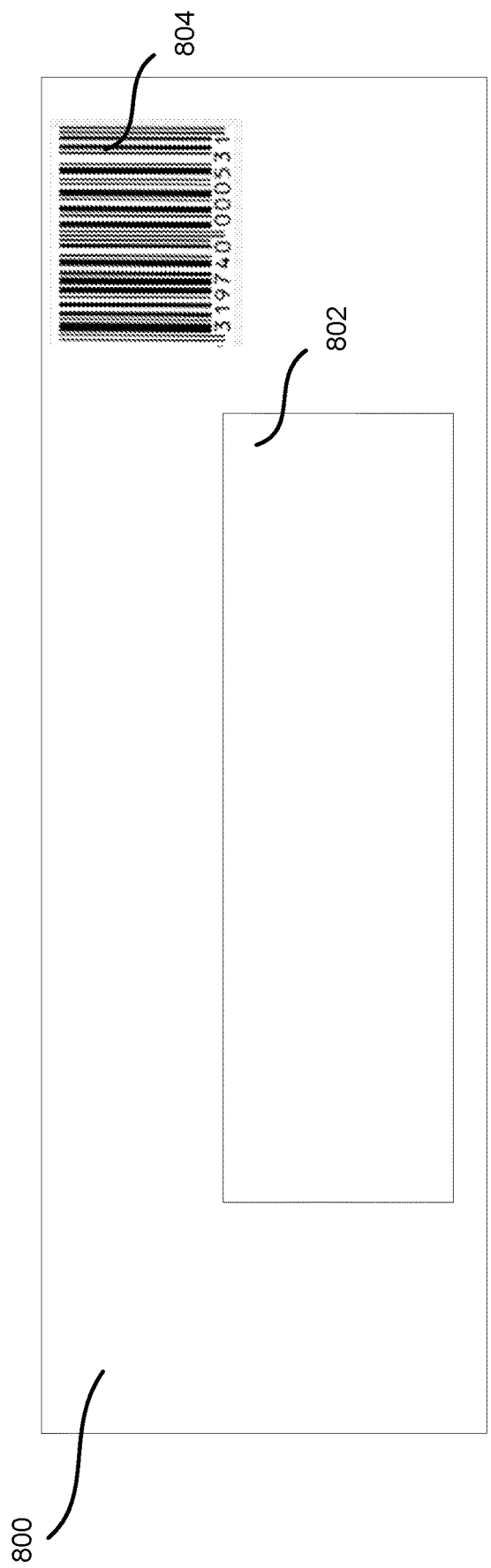
FIG. 8 is an example workpiece container that may be used in conjunction with various examples described herein.

FIG. 8 is an example workpiece container 800 that may be used in conjunction with various examples described herein. The workpiece container 800 may be configured to have stored therein a workpiece 802. As described above, the workpiece 802 can include items such as food, medical items, or other objects intended to be sterilized by electron beam irradiation. The workpiece container 800 may have a predetermined or known absorption rate of electrons that can be accounted for in a calculation of dosage.

The workpiece container 800 also includes a universal product code (UPC) 804. The UPC 804 is used to manage the workpiece container 800 as it moves through an irradiation system. For example, upon the measurement of the dosage received by the workpiece 802, the measured dose can be entered into a system along with the UPC 804 to store information about the dosage received by the workpiece 802. Further, the UPC 804 can be used to manage the workpiece container 800 in other ways. For example, if the measured dosage is above or below standards, the workpiece container 800 can be removed from the irradiation process and placed to the side for further examination. The UPC 804 can be used to track and identify the location of the workpiece container 800.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A horn for use in combination with an electron gun of a radiation system, comprising:
    a plurality of redirector magnets having a magnetic field for steering electrons to an output of the horn;
    a first detector unit comprising a center detector and side detector, the center detector and the side detector each comprising:
        a top plate;
        a bottom plate;
        a sensor pad; and
        a copper wire coiled around a first core and a second core, wherein the coil is wound around the first core and the second core to operate as a balun.

2. The horn of claim 1, wherein a coil of the center detector is wound opposite to coils of the side detector.

3. The horn of claim 2, wherein the center detector acts as a center balun and the side detector act as toroidal baluns.

4. The horn of claim 1, wherein the center detector is offset from the side detector.

5. The horn of claim 1, wherein at least one of the cores is a ferrite core.

6. The horn of claim 1, wherein at least one of the cores is a porcelain core.

7. The horn of claim 1, further comprising a second detector unit comprising a second center detector and a plurality of second side detectors.

8. An irradiation system, comprising:
    a conveyor system having a conveyor belt with rollers having a space between the rollers that allow a passage of an electron field created from an electron beam through the space between the rollers of the conveyor belt; and
    a first horn comprising:
        a portion for receiving electrons;
        a plurality of redirector magnets having a magnetic field for steering the electrons to the output of the first horn;
        a first detector unit for detecting a dosage comprising a center detector and a plurality of side detectors, the center detector and the plurality of side detectors each comprising:
            a top plate;
            a bottom plate;
            a sensor pad; and
            a copper wire coiled around a first core and a second core, wherein the coil is wound around the first core and the second core to operate as a balun.

9. The system of claim 8, wherein a coil of the center detector is wound opposite to coils of the plurality of side detectors.

10. The system of claim 9, wherein the center detector acts as a center balun and the plurality of side detectors act as toroidal baluns.

11. The system of claim 8, wherein the center detector is offset from the plurality of side detectors.

12. The system of claim 8, wherein at least one of the cores is a ferrite core.

13. The system of claim 8, wherein at least one of the cores is a porcelain core.

14. The system of claim 8, further comprising a second detector unit comprising a second center detector and a plurality of second side detectors.

15. The system of claim 8, wherein the workpiece is food.

16. The system of claim 8, wherein the workpiece is a medical device.

17. The system of claim 8, further comprising:
    a second electron beam in a second direction for treating the workpiece, the second direction being a direction towards the first horn; and
    a second horn comprising:
        a second portion for receiving electrons from the second electron gun;
        a second plurality of redirector magnets having a magnetic field for steering the electrons to an output of the second horn;
        a second detector unit for detecting a dosage comprising a center detector and a plurality of side detectors, the center detector and the plurality of side detectors of the second detector each comprising:
            a top plate;
            a bottom plate;
            a sensor pad; and
            a copper wire coiled around a first core and a second core, wherein the coil is wound around the first core and the second core to operate as a balun.

\* \* \* \* \*